United States Patent
Fujii et al.

(10) Patent No.: US 10,068,775 B2
(45) Date of Patent: Sep. 4, 2018

(54) METHOD OF BONDING SUPPORTING SUBSTRATE WITH DEVICE SUBSTRATE FOR FABRICATING SEMICONDUCTOR DEVICE

(71) Applicant: Toshiba Memory Corporation, Tokyo (JP)

(72) Inventors: Mika Fujii, Oita Oita (JP); Kazuyuki Higashi, Yokohama Kanagawa (JP); Kazumichi Tsumura, Shinagawa Tokyo (JP); Takashi Shirono, Oita Oita (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/233,918

(22) Filed: Aug. 10, 2016

(65) Prior Publication Data
US 2017/0069503 A1 Mar. 9, 2017

(30) Foreign Application Priority Data
Sep. 9, 2015 (JP) ................. 2015-177931

(51) Int. Cl.
*H01L 21/304* (2006.01)
*H01L 21/265* (2006.01)
*H01L 21/683* (2006.01)

(52) U.S. Cl.
CPC .......... *H01L 21/304* (2013.01); *H01L 21/265* (2013.01); *H01L 21/6835* (2013.01);
(Continued)

(58) Field of Classification Search
CPC . H01L 21/304; H01L 21/6835; H01L 21/265; H01L 2221/68327; H01L 2221/6834
See application file for complete search history.

(56) References Cited

U.S. PATENT DOCUMENTS

| | | | |
|---|---|---|---|
| 5,071,785 A | 12/1991 | Nakazato et al. | |
| 5,773,352 A * | 6/1998 | Hamajima | H01L 21/76264 257/E21.56 |

(Continued)

FOREIGN PATENT DOCUMENTS

| | | |
|---|---|---|
| JP | 2003160395 A | 6/2003 |
| JP | 2006114847 A | 4/2006 |

(Continued)

OTHER PUBLICATIONS

Taiwanese Office Action dated Sep. 26, 2017, filed in Taiwanese counterpart Patent Application No. 105106353 (8 pages) with English translation.

(Continued)

*Primary Examiner* — Selim Ahmed
(74) *Attorney, Agent, or Firm* — Patterson & Sheridan, LLP

(57) ABSTRACT

According to one embodiment, a method for fabricating a semiconductor device is provided. The method for fabricating the semiconductor device includes three steps of a providing step, a bonding step, and a thinning step. In the providing step, a mitigation layer that mitigates warping of the device substrate being thinned by grinding is provided on the supporting substrate. In the bonding step, the device substrate is bonded to the supporting substrate on which the mitigation layer is provided. In the thinning step, the device substrate supported by the supporting substrate is thinned by grinding.

28 Claims, 5 Drawing Sheets

(52) U.S. Cl.
CPC .............. *H01L 2221/6834* (2013.01); *H01L 2221/68327* (2013.01)

(56) References Cited

U.S. PATENT DOCUMENTS

| | | | |
|---|---|---|---|
| 6,362,075 B1* | 3/2002 | Czagas | H01L 21/2007 257/E21.088 |
| 6,840,447 B2 | 1/2005 | Hirata et al. | |
| 6,865,308 B1 | 3/2005 | Conway et al. | |
| 9,337,080 B2 | 5/2016 | Aga et al. | |
| 2005/0050971 A1 | 3/2005 | Horning | |
| 2006/0194415 A1* | 8/2006 | Lee | H01L 27/14634 438/459 |
| 2007/0063217 A1* | 3/2007 | Brogan | H01L 21/2007 257/133 |
| 2008/0038551 A1 | 2/2008 | Shintani | |
| 2015/0035126 A1* | 2/2015 | Gandhi | H01L 21/76254 257/632 |
| 2015/0064567 A1* | 3/2015 | Boufnichel | H01L 31/0236 429/231.95 |

FOREIGN PATENT DOCUMENTS

| | | |
|---|---|---|
| JP | 2007165663 A | 6/2007 |
| JP | 2009071263 A | 4/2009 |
| JP | 2010-153488 A | 7/2010 |
| JP | 2014-120587 A | 6/2014 |
| TW | 2004-18102 | 9/2004 |
| TW | 2013-01560 | 1/2013 |
| TW | 2015-23704 | 6/2015 |

OTHER PUBLICATIONS

Japanese Office Action dated May 8, 2018, filed in counterpart Japanese Patent Application No. 2015-177931 (8 pages) (with English Translation).

* cited by examiner

METHOD OF BONDING SUPPORTING SUBSTRATE WITH DEVICE SUBSTRATE FOR FABRICATING SEMICONDUCTOR DEVICE

CROSS-REFERENCE TO RELATED APPLICATION

This application is based upon and claims the benefit of priority from Japanese Patent Application No. 2015-177931, filed on Sep. 9, 2015, the entire contents of which are incorporated herein by reference.

FIELD

Embodiments described herein relate generally to a method for fabricating a semiconductor device.

BACKGROUND

There is a method for fabricating a thin semiconductor device by bonding a supporting substrate to a device surface side of a device substrate on which semiconductor devices are formed, and then thinning the rear surface side of the device substrate, while supporting it with the supporting substrate, by grinding.

Here, stress occurs inside the device substrate due to a structure of a semiconductor device. When the device substrate is thinned by grinding, the device substrate, together with the supporting substrate, goes into a warped state due to stress after the grinding step, whereby subsequent device fabricating steps or a substrate transport step cannot be normally performed.

DETAILED DESCRIPTION

According to an embodiment, a method for fabricating a semiconductor device is provided, in which warping of the substrate, generated after a device substrate is bonded to a supporting substrate and ground, is reduced or prevented altogether.

According to one embodiment, a method for fabricating a semiconductor device is provided. The method for fabricating the semiconductor device includes three steps of a providing step, a bonding step, and a thinning step. In the providing step, a mitigation layer that mitigates warping of the device substrate being thinned by grinding is provided on the supporting substrate. In the bonding step, the device substrate is bonded to the supporting substrate on which the mitigation layer is provided, such that a device side of the device substrate is bonded to a side of the supporting substrate on which the mitigation layer is provided. In the thinning step, the device substrate, supported by the supporting substrate, is thinned by grinding the device substrate from a side of the device substrate opposite to the device side.

A method for fabricating a semiconductor device according to the embodiment will be hereinafter described in detail with reference to the accompanying drawings. In addition, the invention is not limited to the embodiment.

Figure 1:
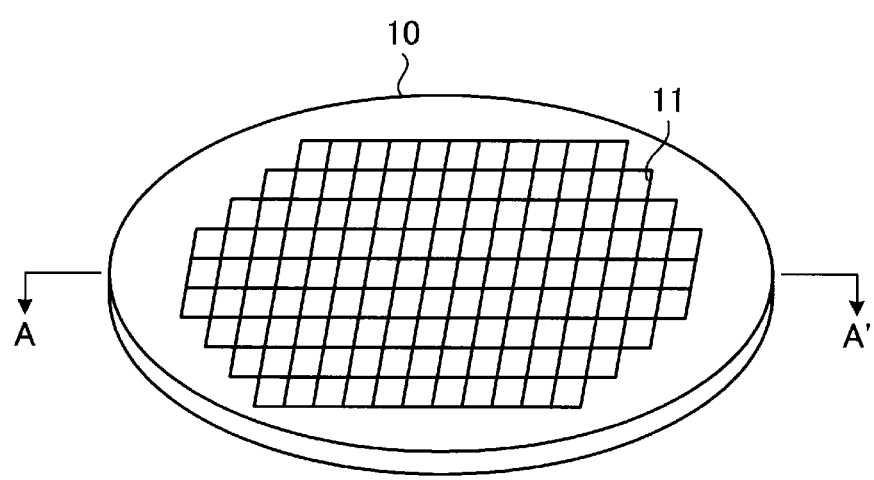
FIG. 1 is a schematic perspective view illustrating an example of a device substrate which is used for a method for fabricating a semiconductor device according to an embodiment.

FIG. 1 is a perspective view illustrating an example of a device substrate which is used in a method for fabricating a semiconductor device according to an embodiment. In the following embodiment, a process in which a device substrate 10 including semiconductor devices 11 on a surface side thereof is prepared, the device substrate 10 is bonded to a supporting substrate which is not illustrated in FIG. 1, and the device substrate 10 supported by the supporting substrate is thinned from a rear side thereof.

In addition, the device substrate 10 which is used in the embodiment is, for example, a silicon wafer or the like having a substantially circular plate shape, and both a front surface and a rear surface of a peripheral portion of the device substrate 10 are beveled.

In the device substrate 10, stress occurs therein (internal stress) due to a structure of the semiconductor device 11. When the device substrate is thinned by grinding, the device substrate together with the supporting substrate is warped by the stress after a grinding step.

Specifically, in the device substrate 10, stress occurs in the device substrate 10 due to stress of a semiconductor layer, a wire layer, a protection layer, or the like included in the semiconductor device 11, and the device substrate 10 together with the supporting substrate is in a warped state resulting from the stress after the grinding step.

More specifically, when the semiconductor device 11 includes a protection layer formed on the device-side surface thereof having, for example, a tensile stress therein, the thinned device substrate 10 is warped in a downwardly projected arc shape by the stress which tends to contract the protection layer in the direction of the center of the diameter of the substrate 10 in an in-plane direction.

In contrast to this, when the semiconductor device 11 includes a protection layer having, for example, compressive stress on the device side surface thereof, the thinned device substrate 10 is warped in an upwardly projected arc shape by the stress which tends to expand the protection layer to the outside direction of the substrate 10 in an in-plane direction, i.e., radially outwardly.

Hence, the method for fabricating a semiconductor device according to the embodiment provides a mitigation layer which mitigates warping of the device substrate 10 thinned by grinding, in the supporting substrate which supports the device substrate 10, to change the warped state thereof. Hereinafter, the method for fabricating the semiconductor device will be described with reference to FIGS. 2A to 2C and FIGS. 3A to 3C.

In addition, hereinafter, a case where the device substrate 10 includes a protection layer having internal stress on a surface of the semiconductor device 11 is exemplified, but the stress occurring inside the thinned device substrate 10 is not limited to the stress of the protection layer.

FIGS. 2A to 2C and FIGS. 3A to 3C are views illustrating cross sections of the semiconductor device subjected to a fabricating method according to the embodiment. The device substrate 10 illustrated in FIGS. 2A to 2C and FIGS. 3A to 3C is a sectional portion taken along line A-A' of the device substrate 10 illustrated in FIG. 1. In the method for fabricating the semiconductor device according to the embodiment, the device substrate 10 and a supporting substrate 20 are first prepared.

Figure 2A:
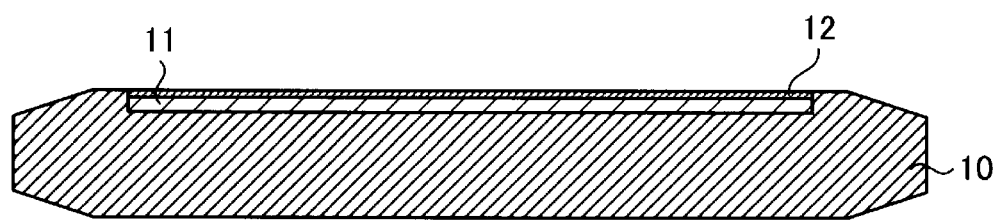
FIGS. 2A to 2C are schematic sectional views taken at section A-A" of FIG. 1 illustrating a cross section of the semiconductor device subjected to a fabricating method according to the embodiment.

As illustrated in FIG. 2A, the device substrate 10 includes a protection layer 12 which protects a surface of the semiconductor device 11 that is formed in a device region on the surface thereof. The protection layer 12 is a stack film which is formed by stacking at least one of a polyimide film, an epoxy film, a phenol-based resin film, a silicon oxide film, a silicon nitride film over the surface of the semiconductor devices 11.

The aforementioned protection layer 12 has tensile stress or compression stress as an inherent physical property of the film. For example, a polyimide film is a film mainly having tensile stress, and when the film is formed on the semiconductor device 11, the polyimide film contracts in the direction of the center of the device substrate 10 in an in-plane direction in the device substrate 10. Hence, when the rear surface of the device substrate 10 is ground to thin the device substrate, the device substrate 10 warps in a downwardly projected arc shape by the stress which shrinks the device surface side of the device substrate 10.

In addition, the aforementioned stack film has tensile stress or compression stress based on the inherent stress of each film in the stack. For example, when the sum of the stresses in the stack film is compressive, the stack film which is formed on the surface of the semiconductor device 11 tends to expand in the direction of the device substrate 10 edge in an in-plane direction in the device substrate 10. Thus, when the device substrate 10 is thinned by grinding away the rear surface thereof, the device substrate 10 is warped in an upwardly projected arc shape by the stress which expands the device substrate 10.

Figure 2B:
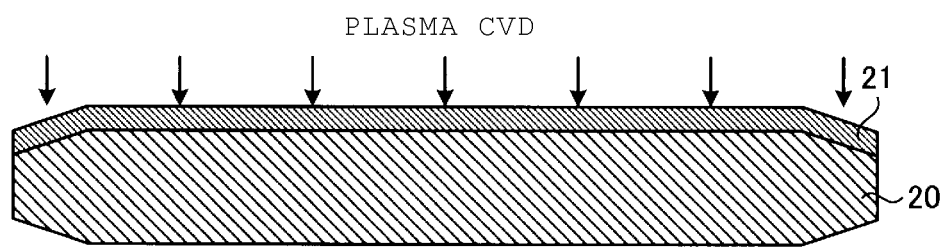

Meanwhile, as illustrated in FIG. 2B, as the supporting substrate 20, glass, silicon, or the like is used, and the supporting substrate 20 has a circular plate shape whose diameter and thickness are substantially the same as those of the device substrate 10. In addition, a material and a shape, such as a diameter or a thickness, of the supporting substrate 20 are not limited thereto.

In addition, the supporting substrate 20 includes an oxide film 21 which is a mitigation layer which mitigates warping of the device substrate 10 thinned by grinding on a surface thereof. The oxide film 21 is formed on a surface of the supporting substrate 20 using a plasma chemical vapor deposition (CVD) method.

In the present embodiment, the thickness of the oxide film 21 is selected to provide an opposing, compensating stress, on the device substrate 10 to maintain planarity of the device substrate 10 after bonding thereof to the supporting substrate 20 and thus prevent the device substrate and accompanying support substrate from being warped as a result of, or during, grinding.

Figure 2C:
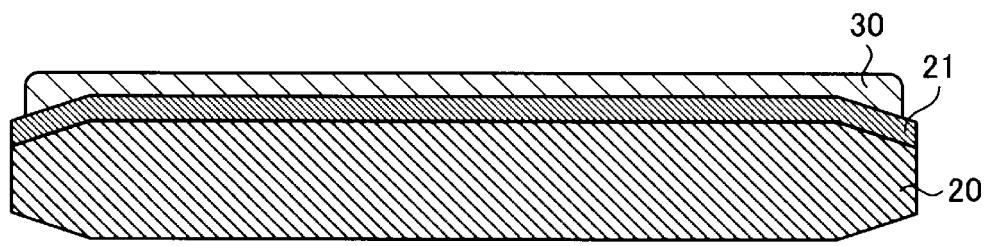

After the device substrate 10 and the supporting substrate 20 are prepared, an adhesive 30 is formed on the surface of the oxide film 21 which is formed on a surface of the supporting substrate 20, using a spin coat method or the like, as illustrated in FIG. 2C. For example, an organic adhesive or the like such as a urethane-based resin or an epoxy resin is used as the adhesive 30.

Figure 3A:
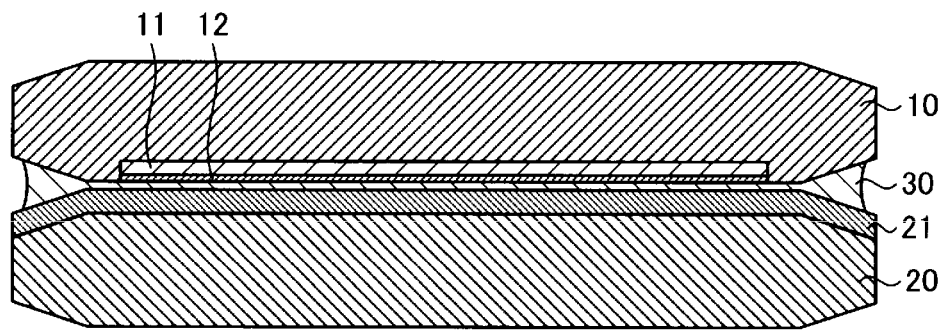
FIGS. 3A to 3C are schematic sectional views taken at section A-A" of FIG. 1 illustrating a cross section of the semiconductor device subjected to a fabricating method according to the embodiment.
Figure 3B:
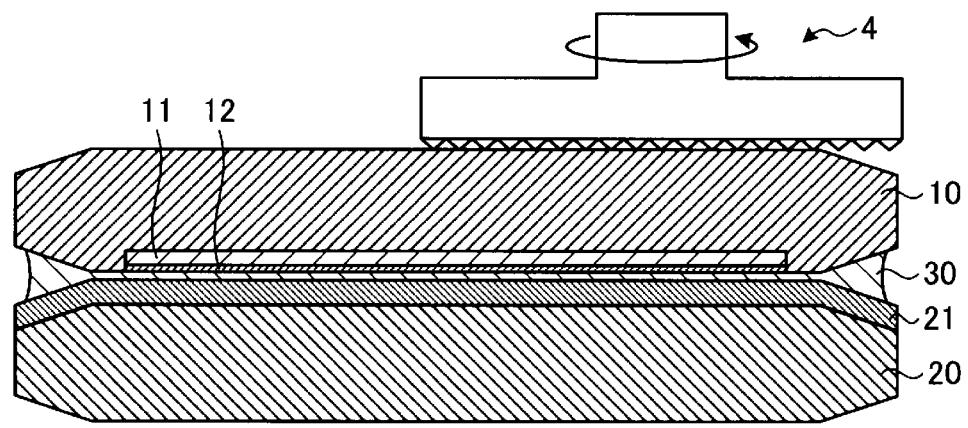

Subsequently, as illustrated in FIG. 3A, a surface of the device substrate 10 whose front and rear surfaces are inverted to each other is bonded to the supporting substrate 20 through the adhesive 30. Thus, the device substrate 10 is thinned to have a predetermined thickness by grinding the rear surface of the device substrate 10 using a grinder 4, as illustrated in FIG. 3B.

Figure 3C:
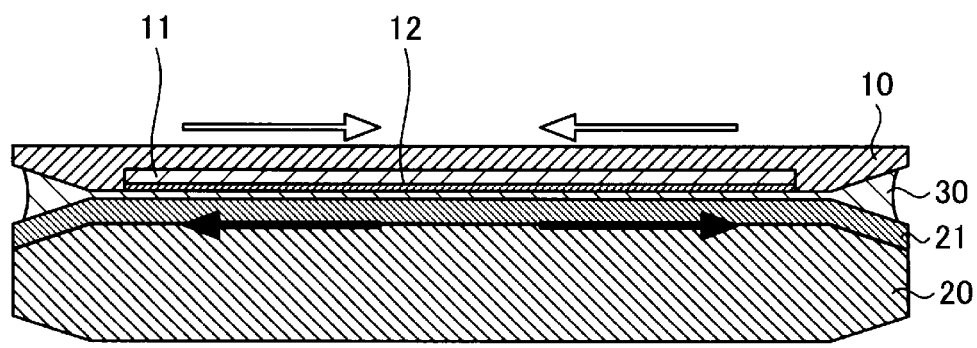

As illustrated in FIG. 3C, when the protection layer 12 formed on the surface of the semiconductor device 11 is a protection layer 12 having tensile stress, the thinned device substrate 10 is warped in a downwardly projected arc shape by the stress which is tends to contract the protection layer toward the center of the substrate in an in-plane direction indicated by a white arrow.

Meanwhile, the supporting substrate 20 includes an oxide film 21 having compression stress formed on the surface of the supporting substrate 20 facing the device substrate 10 in order to mitigate the warping of the thinned device substrate 10, in this example. For this reason, in a free state, the supporting substrate 20 is warped in an upwardly projected arc shape by the stress which tends to expanded the supporting substrate 20 in a radially outward direction in an in-plane direction indicated by a black arrow illustrated in FIG. 3C.

Here, surfaces of the device substrate 10 and the supporting substrate 20 are uniformly bonded together through the adhesive 30. Hence, in the device substrate 10 and the supporting substrate 20 which are bonded together, stress which tends to contract the device substrate 10 and stress which tends to expand the supporting substrate 20 cancel, whereby the warping of the thinned device substrate 10 is reduced or prevented.

That is, in the embodiment, the oxide film 21 which is formed on the surface of the supporting substrate 20 causes stress to occur in the supporting substrate 20, whereby the warping of the device substrate 10 bonded thereto is mitigated. Accordingly, the warping of the supporting substrate 20 which supports the thinned device substrate 10 bonded to the supporting substrate is prevented.

In addition, after the device substrate 10 is thinned, a post-process such as a process in which the device substrate 10 is debonded from the supporting substrate 20 and the device substrate 10 is divided into multiple chips, is performed.

As described above, the method for fabricating the semiconductor device according to the present embodiment includes three steps of a providing step, a bonding step, and a thinning step. In the providing step, the oxide film 21 which mitigates the warping of the device substrate 10 thinned by grinding is provided on the supporting substrate 20. In the bonding step, the device substrate 10 is bonded to the supporting substrate 20 on which the oxide film 21 is provided. In the thinning step, the device substrate 10 supported by the supporting substrate 20 is thinned by grinding.

Thereby, it is possible to prevent or reduce warping of the device substrate 10 and the supporting substrate 20 in the method for fabricating the semiconductor device according to the present embodiment. Hence, in the present embodiment, the warping of the device substrate 10 and the supporting substrate 20 after the grinding step is prevented or reduced, whereby it is possible to normally perform, for example, transport of the supporting substrate 20 performed by a transport arm before the thinned device substrate 10 is debonded therefrom, mounting the supporting substrate 20 on a flat chuck, or the like.

In addition, in the present embodiment, the mitigation layer which mitigates warping of the device substrate 10 thinned by grinding is provided in the supporting substrate 20, whereby it is not necessary to modify a structure of the semiconductor device 11 so that warping does not occur in the device substrate 10. That is, in the present embodiment, a thickness of the oxide film 21 which is formed on the surface of the supporting substrate 20 is adjusted, whereby it is possible to prevent the warping of the thinned device substrate 10 from occurring.

In addition, in the configuration, the oxide film 21 may be formed so as to cover the surface of the supporting substrate 20, whereby, the oxide film 21 has the same stress direction. Additionally, the stress direction of the stress of the oxide film 21 in the plane of the device substrate 10 may differ depending on the region in which the oxide film 21 is formed.

In this case, after the oxide film 21 is formed on the surface of the supporting substrate 20, etching is performed through a resist having a predetermined pattern thereby forming a mask, whereby the predetermined pattern is formed in the oxide film 21. Thereby, the oxide film 21 can provide a different stress on a per region basis.

Hence, by providing the oxide film 21 having a predetermined pattern on the surface of the supporting substrate 20, the warping of the supporting substrate 20 can be finely adjusted.

In addition, the oxide film 21 can be easily removed from the surface of the supporting substrate 20, whereby the supporting substrate 20 from which the device substrate 10 is debonded can be recycled.

In addition, the surface of the supporting substrate 20 is covered with the oxide film 21, whereby it is possible to prevent the surface of the supporting substrate 20 from being physically damaged when the device substrate 10 is debonded from the supporting substrate 20.

In addition, an oxide film 21 with strong adhesion is used for the supporting substrate 20, whereby stress is easily created in the supporting substrate 20 as a result of the stress of the oxide film 21.

In addition, the oxide film 21 with strong adhesion to the adhesive 30 is used, whereby the oxide film 21 can easily bond the device substrate 10 to the supporting substrate 20.

In addition, in the configuration, the oxide film 21 is provided on the surface of the supporting substrate 20, but the location of the oxide film 21 is not limited to the surface of the supporting substrate 20. As another aspect, an oxide film 21a which mitigates stress of the thinned device substrate 10 may be provided on a rear surface of the supporting substrate 20, as illustrated in FIG. 4A.

As described above, it is possible to prevent warping of the device substrate 10 and the supporting substrate 20 from increasing during a grinding step, also in the configuration.

Figure 4A:
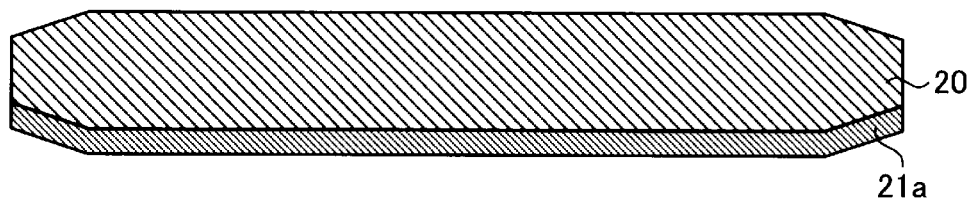
FIGS. 4A and 4B are schematic sectional views illustrating a cross section of the semiconductor device subjected to another fabricating method according to the embodiment.

In addition, in the configuration illustrated in FIG. 4A, the oxide film 21a is provided on the rear surface of the supporting substrate 20, whereby it is possible to prevent the supporting substrate 20 from being damaged by pressing when the device substrate 10 is bonded to the surface of the supporting substrate 20.

Figure 4B:
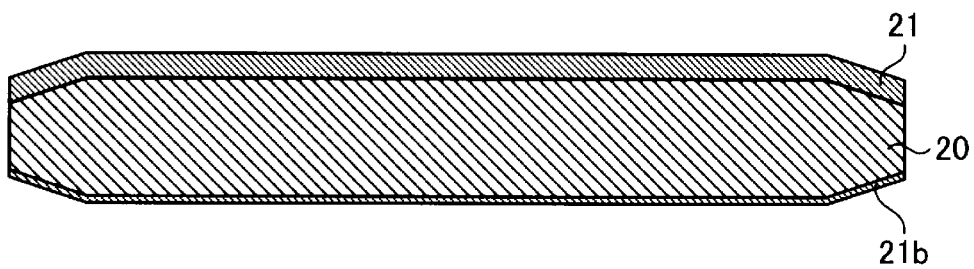

In addition, oxide films 21 and 21b may be provided on both the front surface and the rear surface of the supporting substrate 20, as illustrated in FIG. 4B. In this configuration, the oxide film 21 having a thickness greater than that provided on a rear side surface is provided on a front side surface of the supporting substrate 20 on which the device substrate 10 is bonded.

In a providing step of the oxide films 21 and 21b on the front surface of the supporting substrate 20 in this embodiment, the oxide film 21 having a predetermined thickness is formed on the front side surface of the supporting substrate 20. Thereafter, the oxide film 21b having a thickness smaller than that of the front side surface is formed on the rear side surface of the supporting substrate 20. Hence, it is possible to adjust the stress of the supporting substrate 20 by forming the oxide film 21b on the rear side surface of the supporting substrate 20.

In addition, in the aforementioned embodiment, the adhesive 30 is used for bonding the device substrate 10 to the supporting substrate 20, but the device substrate 10 may be directly bonded to the supporting substrate 20. In this case, the oxide film 21 which is provided on the front surface of the supporting substrate 20 may be used as an oxide film 21 with adhesion, and the device substrate 10 adheres to the supporting substrate 20 by the oxide film 21.

Next, another method for fabricating the semiconductor device according to the present embodiment will be described. In the embodiment, a mitigation layer which mitigates warping of a device substrate thinned by grinding is provided on a front layer or a front surface of a supporting substrate.

Figure 5A:
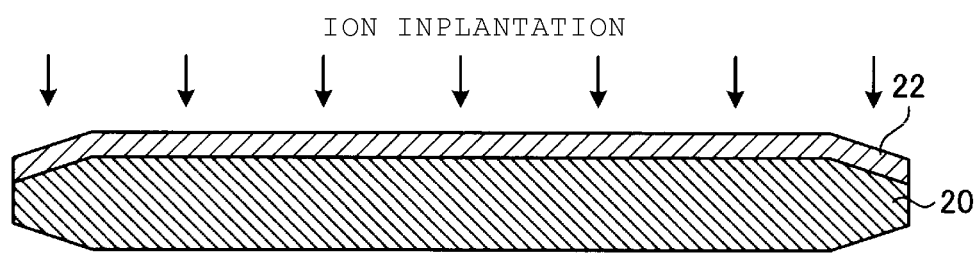
FIGS. 5A and 5B are schematic sectional views illustrating a cross section of the semiconductor device subjected to another fabricating method according to the embodiment.
Figure 5B:
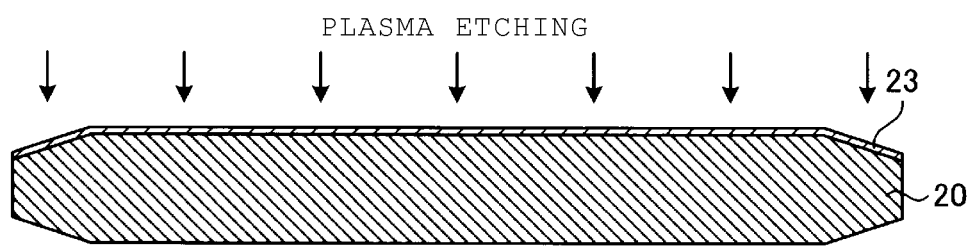

In addition, in the method for fabricating the semiconductor device, the semiconductor device is fabricated through the same steps, except for the step illustrated in FIG. 2B among the steps illustrated in FIGS. 2A to 2C and FIGS. 3A to 3C described above. In the following embodiment, a different step for the step of FIG. 2B will be described with reference to FIGS. 5A and 5B. FIGS. 5A and 5B are explanatory views illustrating a cross section of the semiconductor device subjected to another fabricating method according to the embodiment.

As illustrated in FIG. 5A, the supporting substrate 20 includes an impurity layer 22 which provides a mitigation layer that mitigates warping of the device substrate 10 thinned by grinding, on a front side surface layer to which the device substrate 10 is bonded. The impurity layer 22 is formed by doping with an impurity such as boron (B), phosphorus (P), or arsenic (As). For example, an ion implanting method or the like is used for a doping method.

In the supporting substrate 20, the impurity is doped onto the front side surface layer. Thereby, the impurity concentration of the front side surface layer increases, stress occurs so as to tend to expand the supporting substrate in a radially outward direction in an in-plane direction, and the supporting substrate 20 is thus warped in an upwardly projected arc shape. For example, the supporting substrate 20 is used when the supporting substrate supports the device substrate 10 including the protection layer 12 which has tensile stress and is formed on the surface of the semiconductor device 11.

In addition, the device substrate 10 may be bonded to the rear side surface layer of the supporting substrate 20 whose front and rear surfaces are inverted to each other. The supporting substrate 20 is warped in a downwardly projected arc shape, whereby the supporting substrate is used when the supporting substrate supports the device substrate 10 including the protection layer 12 which has compression stress and is formed on the front surface of semiconductor device 11.

Hence, in the configuration, the impurity layer 22 which is provided on the front side surface layer of the supporting substrate 20 makes stress occur in the supporting substrate 20, and the supporting substrate 20 in which stress occurs mitigates the warping which is generated in the device substrate 10.

In addition, in the embodiment, the doping amount of impurities onto the supporting substrate 20 is set according to the amount of warping of the supporting substrate 20 which is generated when the rear side of the device substrate 10 including the protection layer 12 on a surface thereof is ground to a predetermined thickness to be thinned, and the thinned device substrate 10 is bonded to be supported.

Also in the method for fabricating the aforementioned semiconductor device, it is possible to prevent or decrease warping of the device substrate 10 and the supporting substrate 20 in the grinding step.

In addition, as illustrated in FIG. 5B, the supporting substrate 20 may include a roughness portion 23, which is a mitigation layer that mitigates warping of the device substrate 10, on a front side surface to which the device substrate 10 is bonded as another form. The roughness portion 23 is formed by thinning the front surface of the supporting substrate 20, according to plasma etching or the like.

As the front surface of the supporting substrate 20 is thinned and becomes rough, stress occurs so as to expand the supporting substrate in an in-plane outward direction whereby the supporting substrate 20 is warped in a upwardly projected arc shape. For example, the supporting substrate 20 is used when the supporting substrate supports the device substrate 10 including the protection layer 12 which has tensile stress and is formed on the surface of the semiconductor device 11.

In addition, the device substrate 10 may be bonded to the rear side surface of the supporting substrate 20 whose front and rear surfaces are inverted from each other. The supporting substrate 20 is warped in a downwardly projected arc shape, whereby the supporting substrate is used when the supporting substrate supports the device substrate 10 including the protection layer 12 which has compression stress and is formed on the front surface of semiconductor device 11.

Hence, in the configuration, by the roughness portion 23 which is formed on the front side surface of the supporting substrate 20, stress occurs in the supporting substrate 20, and the supporting substrate 20 in which stress occurs mitigates the warping which is generated in the device substrate 10.

In addition, in the embodiment, the roughening amount of the front surface of the supporting substrate 20 is selected according to the amount of warping of the supporting substrate 20 which is generated when the rear side of the device substrate 10, including the protection layer 12 on a surface thereof, is ground and thinned to a predetermined thickness.

Also in the aforementioned method for fabricating the semiconductor device, it is possible to prevent or decrease warping of the device substrate 10 and the supporting substrate 20 in the grinding step.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for fabricating a semiconductor device comprising:
   providing, on a supporting substrate, a mitigation layer configured to mitigate warping of a device substrate thinned by grinding;
   bonding the device substrate to the supporting substrate via an adhesive, such that a device side of the device substrate is bonded to a side of the supporting substrate on which the mitigation layer is provided;
   thinning the device substrate supported by the supporting substrate by grinding the device substrate from a side of the device substrate opposite to the device side; and
   debonding the thinned device substrate from the supporting substrate.

2. The method according to claim 1, wherein providing the mitigation layer on the supporting substrate includes:
   forming a first chemical vapor deposition (CVD) film on a front surface of the supporting substrate.

3. The method according to claim 2, further comprising:
   forming a second CVD film on a rear surface of the supporting substrate, wherein the first CVD film formed on the front surface of the supporting substrate has a thickness greater than a thickness of the second CVD film formed on the rear surface of the supporting substrate.

4. The method according to claim 1, wherein the providing the mitigation layer on the supporting substrate includes:
   doping impurities onto a surface layer of the supporting substrate.

5. The method according to claim 1, wherein providing the mitigation layer on the supporting substrate includes:
   forming roughness on a surface of the supporting substrate.

6. The method according to claim 5, wherein the mitigation layer includes an inherent internal stress.

7. The method according to claim 6, wherein the mitigation layer is selected so that the inherent internal stress thereof cancels internal stresses of the device substrate.

8. The method according to claim 6, wherein forming roughness on the surface of the supporting substrate includes:
   etching the surface of the supporting substrate by a plasma etching method.

9. The method according to claim 1, wherein providing of the mitigation layer on the supporting substrate includes:
   forming a material layer having an inherent internal stress on a surface of the supporting substrate; and
   selectively etching portions of the material layer to form the mitigation layer.

10. The method according to claim 1, further comprising dividing the thinned device substrate into multiple chips after debonding.

11. The method according to claim 1, further comprising forming the adhesive on the supporting substrate by using a spin coat method.

12. The method according to claim 1, wherein the adhesive is an organic adhesive.

13. The method according to claim 1, wherein the adhesive is a urethane-based resin or an epoxy resin.

14. A method of compensating for warping of a device substrate having internal stresses tending to warp the device substrate, the thickness of which is reduced by removing material from a non-device surface thereof while a device surface thereof is secured to a front side of a supporting substrate, comprising:

modifying inherent internal stresses on the front side of the supporting substrate prior to bonding the device substrate to the front side of the supporting substrate via an adhesive; and debonding the device substrate from the supporting substrate, wherein the modifying the inherent internal stresses on the front side of the supporting substrate compensates for warping of the device substrate to form a generally planar structure including the device substrate attached to the supporting substrate with the adhesive.

15. The method according to claim 14, wherein modifying the inherent internal stresses on the front side of the supporting substrate comprises:
    forming a material layer having an inherent internal stress on a first surface of the supporting substrate on the front side of the supporting substrate.

16. The method according to claim 15, further comprising:
    forming a protection layer over the first surface of the device substrate.

17. The method according to claim 15, wherein the material layer having the inherent internal stress is formed by etching the first surface of the supporting substrate.

18. The method according to claim 15, wherein the material layer having the inherent internal stress is formed by doping impurities on and in the first surface of the supporting substrate.

19. The method according to claim 16, wherein the warping of the device substrate is in part caused by internal stresses in the device substrate.

20. The method according to claim 19, wherein
    along a plane surface direction, the internal stresses in the device substrate causes extension of the surface thereof facing the supporting substrate in a first direction with respect to the center of the device substrate, and
    the internal stresses in the protection layer extends the protection layer in a second, opposed, direction with respect to the center of the device substrate.

21. The method according to claim 20, wherein the first and second directions are radial directions with respect to the center of the substrate.

22. The method according to claim 14, further comprising dividing the thinned device substrate into multiple chips after debonding.

23. The method according to claim 14, further comprising forming the adhesive on the supporting substrate by using a spin coat method.

24. The method according to claim 14, wherein the adhesive is an organic adhesive.

25. The method according to claim 14, wherein the adhesive is a urethane-based resin or an epoxy resin.

26. A method of thinning a device substrate having at least one semiconductor device formed on a device surface thereof, comprising:
    providing a supporting substrate having a first surface, a second surface and a stress profile;
    changing the stress profile of the supporting substrate on at least one of the first and second surfaces;
    bonding the device surface of the device substrate to one of the first and second surfaces;
    supporting a rear surface of the device substrate facing away from the device surface thereof on a grinding wheel with the supporting substrate;
    thinning the device substrate by removing a portion thereof from the rear surface thereof with a grinding apparatus; and
    debonding the thinned device substrate from the supporting substrate.

27. The method of claim 26, wherein the stress profile of the supporting substrate is changed by forming a silicon oxide layer on one of the first and second surfaces.

28. The method of claim 26, further comprising:
    modifying the stress profile of the supporting substrate by etching at least one of the first and second surfaces.

* * * * *